United States Patent
Essers

(10) Patent No.: US 10,984,977 B2
(45) Date of Patent: Apr. 20, 2021

(54) PARTICLE BEAM SYSTEM AND METHOD FOR OPERATING A PARTICLE BEAM SYSTEM

(71) Applicant: Carl Zeiss Microscopy GmbH, Jena (DE)

(72) Inventor: Erik Essers, Aalen (DE)

(73) Assignee: Carl Zeiss Microscopy GmbH, Jena (DE)

(*) Notice: Subject to any disclaimer, the term of this patent is extended or adjusted under 35 U.S.C. 154(b) by 19 days.

(21) Appl. No.: 16/706,431

(22) Filed: Dec. 6, 2019

(65) Prior Publication Data
US 2020/0185185 A1    Jun. 11, 2020

(30) Foreign Application Priority Data

Dec. 10, 2018  (DE) .............. 10 2018 131 614.3

(51) Int. Cl.
*H01J 37/09* (2006.01)
*H01J 37/12* (2006.01)
*H01J 37/28* (2006.01)

(52) U.S. Cl.
CPC .............. *H01J 37/09* (2013.01); *H01J 37/12* (2013.01); *H01J 37/28* (2013.01); *H01J 2237/006* (2013.01); *H01J 2237/244* (2013.01); *H01J 2237/2801* (2013.01)

(58) Field of Classification Search
CPC ........ H01J 37/28; H01J 37/145; H01J 37/244; H01J 2237/188; H01J 2237/2608; H01J 37/09; H01J 37/12; H01J 37/18; H01J 2237/244; H01J 2237/24445; H01J 2237/2448; H01J 2237/2801; H01J 37/1471; H01J 37/222; H01J 37/3005; H01J 37/3056; H01J 2237/006; H01J 2237/0262; H01J 2237/2449; H01J 2237/026
USPC ............ 250/310, 311, 288, 307, 396 R, 397, 250/492.3, 505.1
See application file for complete search history.

(56) References Cited

U.S. PATENT DOCUMENTS 5,164,594 A    11/1992   Thompson et al.
5,677,530 A    10/1997   Sato et al.
(Continued)

FOREIGN PATENT DOCUMENTS

DE              696 24 192 T2    3/1997
DE         10 2006 059 162 A1    6/2008
DE         10 2010 001 349 A1    8/2011

OTHER PUBLICATIONS

German Office Action, with translation thereof, for corresponding DE application No. 10 2018 131 614.3 dated Aug. 12, 2019.

*Primary Examiner* — David A Vanore
(74) *Attorney, Agent, or Firm* — Fish & Richardson P.C.

(57) ABSTRACT

A particle beam system for examining and processing an object includes an electron beam column and an ion beam column with a common work region, in which an object may be disposed and in which a principal axis of the electron beam column and a principal axis of the ion beam column meet at a coincidence point. The particle beam system further includes a shielding electrode that is disposable between an exit opening of the ion beam column and the coincidence point. The shielding electrode is able to be disposed closer to the coincidence point than the electron beam column.

20 Claims, 7 Drawing Sheets

(56) References Cited

U.S. PATENT DOCUMENTS

| | | | | |
|---|---|---|---|---|
| 6,452,173 B1* | 9/2002 | Oi | ............... | H01J 37/141 |
| | | | | 250/310 |
| 6,590,210 B1* | 7/2003 | Essers | ............... | H01J 37/244 |
| | | | | 250/397 |
| 8,759,800 B2* | 6/2014 | Fober | ............... | H01J 37/248 |
| | | | | 250/492.3 |
| 9,741,528 B2* | 8/2017 | Albiez | ............... | H01J 37/18 |
| 10,068,744 B2* | 9/2018 | Essers | ............... | H01J 37/244 |
| 2009/0309025 A1* | 12/2009 | Preikszas | ............... | H01J 37/3056 |
| | | | | 250/311 |
| 2011/0220788 A1* | 9/2011 | Laue | ............... | H01J 49/065 |
| | | | | 250/288 |
| 2014/0361165 A1* | 12/2014 | Sed'a | ............... | H01J 37/3005 |
| | | | | 250/307 |
| 2018/0025885 A1* | 1/2018 | Imai | ............... | H01J 37/28 |
| | | | | 250/311 |

\* cited by examiner

PARTICLE BEAM SYSTEM AND METHOD FOR OPERATING A PARTICLE BEAM SYSTEM

CROSS-REFERENCE TO RELATED APPLICATION

This application claims benefit under 35 U.S.C. § 119 to German Application No. 10 2018 131 614.3, filed Dec. 10, 2018. The contents of this application is hereby incorporated by reference in its entirety.

FIELD

The present disclosure relates to a particle beam system for examining and processing an object and to a method for operating the particle beam system.

BACKGROUND

Conventional particle beam systems include an electron beam column for generating an electron beam and an ion beam column for generating an ion beam, wherein the two particle beams can be directed on a common work region in order thus to examine a region of an object with the electron beam and process same region with the ion beam. In such conventional particle beam systems, the ion beam column is commonly used to process the object, for example to remove material from the object or deposit material on the latter. The object is typically scanned by the electron beam and the secondary electrons generated in process and the backscattered electrons are detected in order thus to record an image of the object and hence monitor the advance of the processing. Depending on the application, low-energy secondary electrons or higher energy backscattered electrons may be of particular interest here.

The highest precision when processing and examining the object can be obtained in each case when the respectively employed particle beam strikes the object in substantially perpendicular fashion. Thus, the highest precision for processing with the ion beam can be achieved when the ion beam strikes the object in perpendicular fashion. The highest resolution and the best detection efficiency for imaging the object can be obtained when the electron beam strikes the object in substantially perpendicular fashion. Thus, many applications involve the object to be frequently aligned with respect to the ion beam column and the electron beam column.

Conventional particle beam systems, in which an electric field is generated within the electron beam column by the electron beam column in order to reduce the kinetic energy of the electrons of the electron beam prior to the emergence thereof from the electron beam column, are known. However, the electric field also extends from the electron beam column up to the object. In configurations where the object is oriented substantially perpendicular to the ion beam, the electric field causes secondary particles generated at the object to be accelerated substantially perpendicular to the surface in the region of the surface of the object. This may lead to it only being possible to detect a small proportion of the secondary particles emanating from the object via detectors disposed in the interior of the electron beam column.

Field

The present disclosure seeks to provide a particle beam system and a method for operating the particle beam system, by which an object can be processed with high precision and high efficiency can be obtained when detecting the secondary particles emanating from the object.

One aspect of the present disclosure relates to a particle beam system for examining and processing an object. The particle beam system includes an electron beam column that is configured to generate an electron beam. The particle beam system further includes an ion beam column that is configured to generate an ion beam. The electron beam column and the ion beam column have a common work region, in which one region of the object can be processed by the ion beam and in which the same region of the object can be examined by the electron beam. The object can be disposed in the common work region.

The electron beam column has a principal axis, which corresponds to the axis of symmetry of a particle-optical lens of the electron beam column, for example. The ion beam column, too, has a principal axis, which corresponds to the axis of symmetry of the particle-optical lens of the ion beam column, for example. The principal axis of the electron beam column and the principal axis of the ion beam column meet at a coincidence point, which lies in the common work region. This means that the two principal axes come so close that work with high precision can be carried out both with the electron beam and with the ion beam in the common work region. The coincidence point is the point of intersection of the principal axis of the electron beam column with the principal axis of the ion beam column. If the principal axis of the electron beam column and the principal axis of the ion beam column do not meet (intersect), the coincidence point is defined as the midpoint of the shortest path between the principal axis of the electron beam column and the principal axis of the ion beam column. The principal axis of the electron beam column and the principal axis of the ion beam column include an angle that differs from zero, for example 54° or 90°.

The particle beam system further includes a shielding electrode, which may be disposed in a first position. When the shielding electrode is disposed in the first position, the shielding electrode is disposed between an exit opening of the ion beam column, from which the ion beam can emerge from the ion beam column towards the common work region, and the coincidence point and the shielding electrode at least partly surrounds the principal axis of the ion beam column between the exit opening of the ion beam column and the coincidence point.

The shortest distance between the shielding electrode disposed in the first position and the coincidence point is referred to as shielding electrode-coincidence point distance. The shortest distance between the electron beam column and the coincidence point is referred to as electron beam column-coincidence point distance. The particle beam system is distinguished in that the shielding electrode-coincidence point distance is shorter than the electron beam column-coincidence point distance. Hence, the shielding electrode is closer to the coincidence point than the electron beam column.

The electron beam column can generate an electric field between the electron beam column and the coincidence point. The "form" of the electric field is influenced both by the electron beam column and by the object or an object holder. The electric field can primarily serve to reduce the kinetic energy of the electrons of the electron beam generated by the electron beam column. However, as described below, the electric field can also serve to improve the detection of secondary particles using detectors that are disposed in the interior of the electron beam column for the purposes of detecting the secondary particles. If an electric field is generated between the electron beam column and the coincidence point by the electron beam column, the shielding electrode disposed in the first position brings about the following two advantages: Firstly, the ion beam is shielded from the electric field by the shielding electrode such that the ion beam is not influenced, or only influenced to a small extent, by the electric field, as a result of which the ion beam can be directed with high precision on the object. Moreover, the electric field is formed by the shielding electrode in such a way that secondary particles emanating from the object are accelerated by the electric field in such a way that the secondary particles are guided with high efficiency to a detector disposed in the interior of the electron beam column.

According to one embodiment, the ratio of the shielding electrode-coincidence point distance to the electron beam column-coincidence point distance is no more than 0.9 when the shielding electrode is disposed in the first position. Preferably, the ratio is no more than 0.8, more preferably no more than 0.7.

In this embodiment, the shielding electrode is significantly closer to the coincidence point than the electron beam column, and so the ion beam is well shielded from the electric field generated by the electron beam column and the electric field is formed by the shielding electrode in such a way that the secondary particles emanating from the object can be detected efficiently.

According to a further embodiment, when the shielding electrode is disposed in the first position, the ratio of the shielding electrode-coincidence point distance to an ion beam column-coincidence point distance, which is the shortest distance between the ion beam column and the coincidence point, is at most 0.5, in particular at most 0.4, more particularly at most 0.3.

In this embodiment, approximately at least half of the path that the ion beam desirably travels towards the coincidence point following its emergence from the ion beam column is shielded by the shielding electrode when the shielding electrode is disposed in the first position. This improves the precision with which the ion beam can be directed on the object.

According to a further embodiment, the ratio of the length of the shielding electrode along the principal axis of the ion beam column to an ion beam column-coincidence point distance, which is the shortest distance between the ion beam column and the coincidence point, has a value that is at least 0.2, preferably at least 0.35, and more preferably at least 0.5.

In this embodiment, the shielding electrode has a minimum length along the principal axis of the ion beam column in relation to the smallest distance between the ion beam column and the coincidence point. Accordingly, approximately at least 20% or at least 35% or at least 50% of the path length that the ion beam desirably travels following its emergence from the ion beam column until it reaches the coincidence point (i.e., until it strikes the object) is shielded by the shielding electrode from the electric field generated by the electron beam column. This reduces the effect of the electric field on the trajectory of the ion beam, as a result of which the precision with which the ion beam can be directed on the object is increased.

According to a further embodiment, the shielding electrode has an electrically conductive surface. Firstly, this avoids uncontrolled electric charging of the shielding electrode and, secondly, this ensures that the shielding electrode is suited to further influence the electric field in its form, the electric field being generated by the electron beam column and being influenced in its form by the object or an object holder. In particular, this can apply a predetermined, adjustable electric potential to the shielding electrode in order to manipulate the form of the electric field in targeted fashion.

According to a further embodiment, the shielding electrode has a form that extends along the principal axis of the ion beam column, enclosing the principal axis of the ion beam column. By way of example, the shielding electrode includes a channel extending along the principal axis of the ion beam column in order to guide the ion beam therein, with the channel being cladded in order to enclose the principal axis of the ion beam column. However, the cladding need not be completely closed and may have openings.

According to a further embodiment, the shielding electrode can be disposed in a second position, in which the shielding electrode does not surround the principal axis of the ion beam column. In particular, the particle beam system may include a movement apparatus that is configured to selectively dispose the shielding electrode in the first position or in the second position.

In this embodiment, the shielding electrode can be disposed in the first or second position. When disposed in the first position, the shielding electrode brings about the above-described advantages. When disposed in the second position, the particle beam system can be used in conventional fashion since the shielding electrode has substantially no influence on the trajectory of the electron beam and of the ion beam, and on the trajectories of the secondary particles emanating from the object.

When the shielding electrode is disposed in the first position, the freedom of movement of the object to be examined and processed is restricted in the common work region since the shielding electrode is disposed closer to the coincidence point, and hence closer to an object disposed at the coincidence point, than the electron beam column. In order to avoid a collision between the object and the shielding electrode while the object is moved, the shielding electrode can be disposed in the second position in which the shielding electrode is disposed further away from the coincidence point than the electron beam column.

The particle beam system may include further components, for example detectors, manipulators, gas supply systems and the like. Some of the components can be used while the shielding electrode is disposed in the first position. In order to use such components, it may be advantageous or desired to dispose the shielding electrode in the second position. Some components can be driven-in in the direction of the coincidence point. For some of such components, it may be advantageous or desired to dispose the shielding electrode in the second position when driving-in the components.

According to a further embodiment, the electron beam column has an exit opening, from which the electron beam can emerge from the electron beam column towards the common work region, and the electron beam column is configured to generate an electric field, in particular a static electric field, between the exit opening of the electron beam column and the coincidence point, the electric field being suitable for decelerating the electron beam.

In this embodiment, the electron beam column generates an electric field, which can decelerate the electron beam, between the exit opening of the electron beam column and the coincidence point, and hence also in the common work region. This accelerates secondary particles emanating from the object, possibly increasing the efficiency of detection of these secondary particles. However, this electric field also has an effect on the trajectory of the ion beam, with this influence being able to be reduced by virtue of the shielding electrode being disposed in the first position.

According to a further embodiment, the shielding electrode is formed in such a way that the shielding electrode, when disposed in the first position, influences the electric field in such a way that secondary particles emanating from the common work region are guided more efficiently to the exit opening of the electron beam column than when the shielding electrode is in the second position.

In this embodiment, the shielding electron influences the form of the electric field, generated by the electron beam column and influenced in terms of its form by the object or an object holder, between the exit opening of the electron beam column and the coincidence point. Here, the form is influenced in such a way that secondary particles emanating from the object or from the common work region are guided more efficiently to the exit opening of the electron beam column than is the case when the shielding electrode is disposed in the second position. Consequently, the shielding electrode causes the secondary particles emanating from the object to be able to be detected more efficiently by detectors disposed in the interior of the election beam column. In particular, the form of the electric field can be influenced by an adjustable electric potential that is applied to the shielding electrode.

According to a further embodiment, the effect of the shielding electrode on the electric field is characterized with the aid of a test object. The test object has a plane metallic surface. Consequently, the surface of the test object is electrically conductive. When the plane metallic surface of the test object is disposed at the coincidence point and oriented substantially perpendicular to the principal axis of the ion beam column, there is an acute angle between the principal axis of the electron beam column and the direction of the electric field at the test point, which has a first value when the shielding electrode is disposed in the first position and which has a second value when the shielding electrode is disposed in the second position, wherein the test point between the plane metallic surface of the test object and the exit opening of the election beam column is disposed at a distance of no more than 2000 μm from the coincidence point. The shielding electrode is formed in such a way that the first value is smaller than the second value. Alternatively, the position of the test point can be defined depending on its distance from the surface of the test object. By way of example, the test point is disposed at a distance of no more than 2000 μm from the plane metallic surface of the test object, between the plane metallic surface of the test object and the exit opening of the electron beam column. The respective distance may also be shorter, for example no more than 1000 μm or no more than 100 μm.

According to a further embodiment, the electron beam column, in its interior, includes at least one detector for detecting secondary particles. In particular, the detector is suitable for detecting secondary electrons with a kinetic energy of up to 50 eV.

According to a further embodiment, the particle beam system further includes a potential source, which is configured to apply an adjustable electric potential to the shielding electrode. This allows the effect of the shielding electrode on the electric field to be set.

According to a further embodiment, the electron beam column includes an end cap, wherein the end cap includes the element of the electron beam column closest to the coincidence point. The particle beam system may further include a potential source, which is configured to apply an adjustable electric potential to the end cap. In particular, the potential applied to the end cap can be less than a potential applied to the object or an object holder. As a result of the shielding electrode, an offset of the ion beam caused by changing the electric potential of the end cap can be minimized.

The form of electric field between the exit opening of the electron beam column and the coincidence point can be manipulated by the electric potential applied to the end cap, by the electric potential applied to the object or an object holder and by the electric potential applied to the shielding electrode. In particular, the form of the electric field between the exit opening of the electron beam column and the coincidence point can be manipulated by way of the differences between these electric potentials.

The electric potential applied to the end cap can be greater than the electric potential applied to the object or an object holder, for example greater by no more than 50 V or by no more than 200 V. Alternatively, the electric potential applied to the end cap can be less than the electric potential applied to the object or an object holder, for example less by no more than 50 V or by no more than 100 V.

The electric potential applied to the shielding electrode can be greater than the electric potential applied to the object or an object holder, for example greater by no more than 30 V. Alternatively, the electric potential applied to the shielding electrode can be less than the electric potential applied to the object or an object holder, for example less by no more than 40 V or by no more than 100 V.

A further aspect of the present disclosure relates to a method for operating the particle beam system that is described herein. The method includes a first sequence, the first sequence including: disposing the shielding electrode in the first position; disposing the object in the common work region in such a way that a surface portion of the object to be processed and to be examined is oriented substantially perpendicular to the principal axis of the ion beam column; and processing the surface portion of the object with the ion beam while the shielding electrode is disposed in the first position and the surface portion is oriented substantially perpendicular to the principal axis of the ion beam column.

According to the two steps mentioned first, the particle beam system is configured for processing the object. To this end, the shielding electrode is disposed in the first position such that the ion beam is shielded against external electric and magnetic fields. Moreover, the surface portion of the object to be processed by the ion beam is oriented perpendicular to the principal axis of the ion beam column such that the object, for the purposes of processing same, is disposed optimally with respect to the ion beam column. "Substantially perpendicular" means that the surface portion is oriented perpendicular to the principal axis of the ion beam column with conventional accuracy for the art. By way of example, the deviation from a right angle is no more than 10°, preferably no more than 5°. The surface portion includes an area of at least 50 nm×50 nm or of at least 200 nm×200 nm and of no more than 1 mm×1 mm or 2 mm×2 mm. A surface normal of the surface portion, which is to be oriented parallel to the principal axis of the ion beam column according to this feature, has a direction that emerges from averaging a multiplicity of surface normals at a multiplicity of locations within the surface portion. Moreover, the object is disposed in the common work region, meaning that the surface portion is disposed near the coincidence point, for example having a distance therefrom of no more than 0.5 mm.

Thereupon, the surface portion is processed by the ion beam in this configuration of the particle beam system. On account of the properties of this configuration, the processing can be carried out with high precision.

In order to control the processing of the ion beam and/or in order to detect the progress of the processing and/or in order to examine the surface portion, the first sequence may further include: detecting secondary particles emanating from the surface portion using a detector disposed in the interior of the electron beam column while the shielding electrode is disposed in the first position and the surface portion is oriented substantially perpendicular to the principal axis of the ion beam column.

Secondary particles emanating from the surface portion are detected without having to change the configuration of the particle beam system, i.e., while maintaining the arrangement of the shielding electrode in the first position and the arrangement of the surface portion with respect to the principal axis of the ion beam column. The secondary particles can be detected more efficiently by an electric field that is generated by the electron beam column and that is influenced by the object or object holder in terms of its form, and by the influence of the shielding electrode disposed in the first position on the form of the field. Image data that represent an image of the object can be generated on the basis of the detected secondary particles. The image data, in turn, can be used to control the electron beam column.

The secondary particles can be generated by the interaction of the ion beam with the object. Further, or alternatively, the secondary particles can be generated by an interaction of the electron beam, generated by the electron beam column, that is directed on the surface portion.

Processing the surface portion with the ion beam, detecting secondary particles and directing the electron beam on the object portion can be carried out simultaneously or successively and, in particular, repeatedly.

According to one embodiment, the method further includes a second sequence, wherein the second sequence includes: disposing the shielding electrode in the second position; disposing the object in such a way that the surface portion of the object is oriented substantially perpendicular to the principal axis of the electron beam column; and directing the electron beam on the surface portion of the object and detecting secondary particles emanating from the surface portion as a result thereof using a detector disposed in the interior of the electron beam column, wherein directing and detecting is carried out while the shielding electrode is disposed in the second position and the surface portion is oriented substantially perpendicular to the principal axis of the electron beam column.

An image of the object with the highest possible resolution should be recorded in the second sequence using the electron beam column. In order to be able to optimally align the object with respect to the electron beam column, the shielding electrode is disposed in the second position such that the shielding electrode does not restrict the freedom of movement of the object. The surface portion of the object (previously processed by the ion beam) is oriented substantially perpendicular to the principal axis of the electron beam column. "Substantially perpendicular" means that the surface portion is oriented perpendicular to the principal axis of the electron beam column with conventional accuracy for the art. By way of example, the deviation from a right angle is no more than 5°.

The electron beam column obtains the highest precision in this configuration. The detected secondary particles can be used to generate image data, which represent an image of the object.

According to a further embodiment, the second sequence may further include: processing the surface portion with the ion beam while the shielding electrode is disposed in the second position and the surface portion is oriented substantially perpendicular to the principal axis of the electron beam column.

The steps of the second sequence can be carried out simultaneously or in succession and, in particular, repeatedly.

The first and second sequence can be carried out simultaneously or in succession and, in particular, repeatedly. Further particularly, the secondary particles detected during the second sequence and image data generated therefrom can be used to control the electron beam column and the ion beam column in the first sequence. Analogously, the secondary particles detected during the first sequence and image data generated therefrom can be used to control the electron beam column and the ion beam column in the second sequence.

According to a further embodiment, the method furthermore includes: generating an electric field, in particular a static electric field, between an exit opening of the electron beam column, from which the electron beam can emerge from the electron beam column towards the common work region, and the coincidence point by the electron beam column, wherein the electric field is suitable for decelerating the electron beam.

The advantages explained above in conjunction with the particle beam system are obtained by way of the electric field. The electric field can be generated for the duration of the first sequence and for the duration of the second sequence. In particular, the electric field is generated while the surface portion is processed by the ion beam in the first sequence and while secondary particles emanating from the surface portion are detected using a detector disposed in the interior of the electron beam column. Therefore, there is no need to modify the electric potentials that are used to generate electric field. In particular, the electric potentials applied to generate the electric field at the various elements of the particle beam system (shielding electrode, end cap, object) are not modified or kept constant while the method is carried out.

BRIEF DESCRIPTION OF THE DRAWING

Embodiments of the disclosure are explained in greater detail below with reference to figures, in which.

DESCRIPTION OF EXEMPLARY EMBODIMENTS

Figure 1:
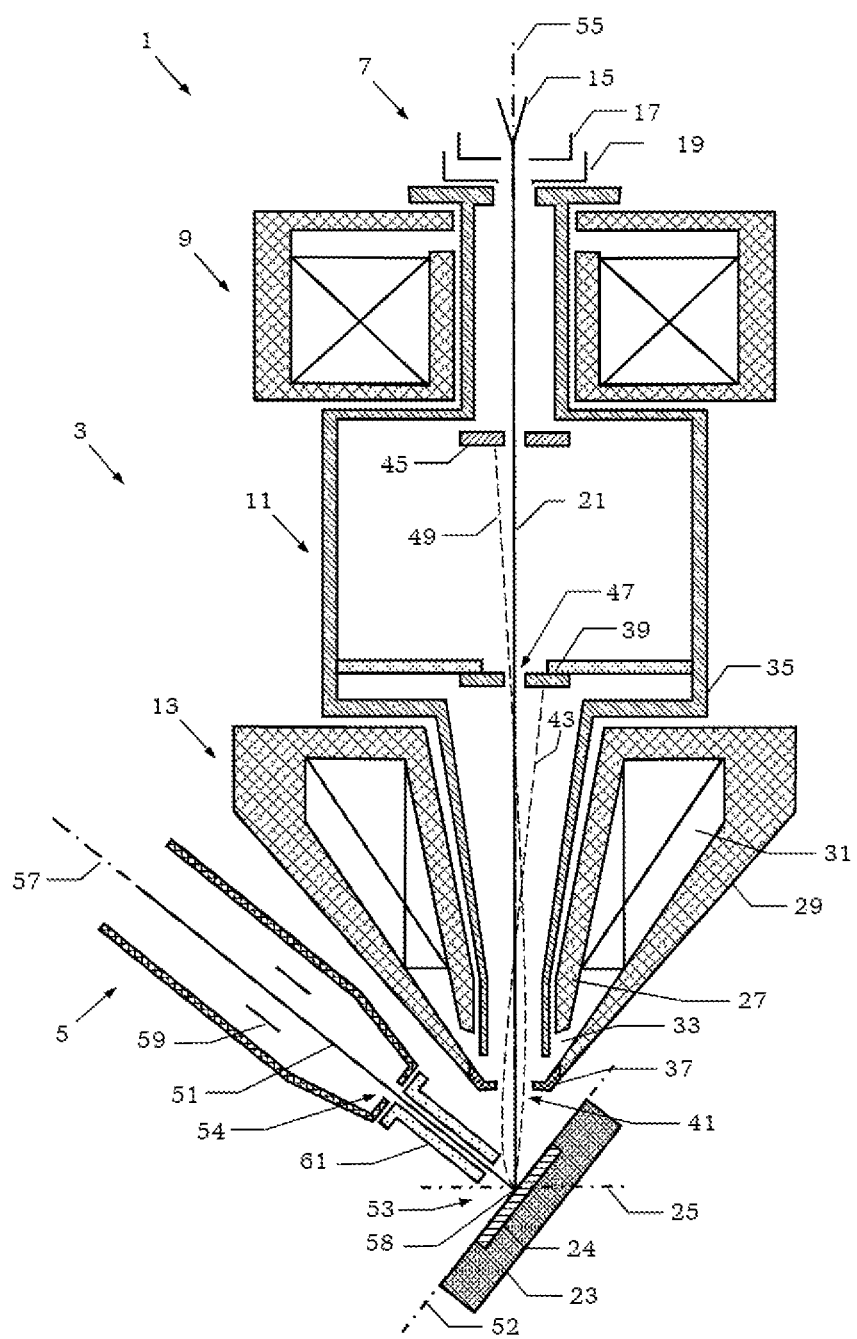
FIG. 1 shows a particle beam system according to an embodiment in a first mode of operation.

FIG. 1 shows a particle beam system 1 according to an embodiment in a first mode of operation. The particle beam system 1 includes an electron beam column 3, which is configured as a scanning electron microscope, and an ion beam column 5.

The electron beam column 3 includes a particle source 7, a condenser lens 9, a booster 11 and an objective lens 13. The particle source 7 includes a cathode 15, a suppression electrode 17 and an extraction electrode 19. An electron beam 21, which extends between the cathode 15 and a surface portion 24 of an object 23 to be examined or processed, is generated by the particle source 7. The electron beam 21 extends through the condenser lens 9, the booster 11 and the objective lens 13. The electron beam column 3, in particular the objective lens 13, is configured in such a way that the electron beam 21 is focused on an object plane 25.

The booster 11 is configured to surround a part of the electron beam 21 such that the electrons of the electron beam 21 can pass through the booster 11 with a higher kinetic energy, for example with a kinetic energy that is elevated by 10 keV in comparison with the case without a booster 11. As a result, spherical and chromatic aberrations of the objective lens 13 and the condenser lens 9 are minimized and the influence of disturbing fields is reduced.

The objective lens 13 includes an inner pole piece 27, an outer pole piece 29 and an exciter coil 31 in order to generate a magnetic field in a gap 33 between the inner pole piece 27 and the outer pole piece 29. The objective lens 13 furthermore includes a first electrode 35 which is formed by an object-side end portion of the booster 11 and a second electrode 37 which is disposed at an object-side end portion of the outer pole piece 29 and also referred to as an end cap. Consequently, the objective lens 13 is a combined magnetic and electrostatic objective lens. The second electrode (end cap) 37 can be electrically insulated from the outer pole piece 29 in such a way that an electric potential can be applied to the second electrode 37 (end cap) which differs from a potential that is applied to the outer pole piece 29 or the first electrode 35.

The electron beam column 3 furthermore includes a first detector 39 for detecting secondary particles (in particular secondary electrons), wherein the first detector 39 is disposed within the booster 11 and consequently within the electron beam column 3. The first detector 39 is configured to detect secondary particles emanating from the object 23, which enter the interior of the electron beam column 3 through an object-side exit opening 41 of the electron beam column 3 and strike the first detector 39. An exemplary trajectory 43 of a secondary electron is illustrated by way of a dashed line.

The electron beam column 3 includes a second detector 45 within the booster 11 for detecting secondary particles. The second detector is configured to detect secondary particles (in particular back-scattered electrons) that travel from the object 23 through the exit opening 41 into the interior of the objective lens 13 and strike the second detector 45 through an opening 47 in the first detector 39. An exemplary trajectory 49 of a back-scattered electron is illustrated by way of a dashed line.

A first electric potential can be applied to the first electrode 35 and a second electric potential can be applied to the second electrode (end cap) 37, with the second electric potential possibly being smaller than the first electric potential. In this way, the electron beam 21, after passing through the booster 11 and before emerging from the electron beam column 3 through the exit opening 41, is decelerated, that is to say the kinetic energy of the electrons of the particle beam 21 is reduced as a result thereof.

Moreover, a third electric potential that can be equal to or greater than or less than the second potential of the second electrode (end cap) 37 can be applied to the object 23. As a result, the form of the electric field that is generated by the electron beam column and influenced in terms of its form by the object or an object holder can be influenced further.

An electric field, in particular an electrostatic field, is generated between the exit opening 41 of the electron beam column 3 and the object 23 by applying the aforementioned electric potentials to the first electrode 35 and to the second electrode 37 (and to the object 23). This causes the electron beam 21 to be decelerated. Further effects of the electric field are described below.

The ion beam column 5 is configured to generate an ion beam 51, which is suitable for processing the object 23, in particular for removing material from the object 23 or depositing material on the object 23 with the infeed of a process gas. The ion beam 51 is focused on an object claim 52, in which the object 23 can be disposed. The electron beam column 3 and the ion beam column 5 have a common work region 53, in which a main axis 55 of the electron beam column 3 and a main axis 57 of the ion beam column 5 meet at a coincidence point 58. The ion beam column 5 includes an exit open 54, from which the ion beam 51 can emerge from the ion beam column 5 towards the common work region 53. The ion beam column 5 includes deflectors 59 that can deflect the ion beam 51 so as to be able to process different locations of the object 23.

The ion beam column 5 can be formed and disposed in such a way that the distance of the ion beam column 5 from the object plane 25 is greater than or equal to the distance of the electron beam column 3 (or the end cap 37) from the object plane 25. As a result, the ion beam column 5 has the same distance from the object as, or is further away from the object than, the electron beam column 3 or the end cap 37 when an object 23 with a plane surface is oriented substantially perpendicular to the principal axis 55 of the electron beam column 3. This facilitates a short working distance.

Figure 3:
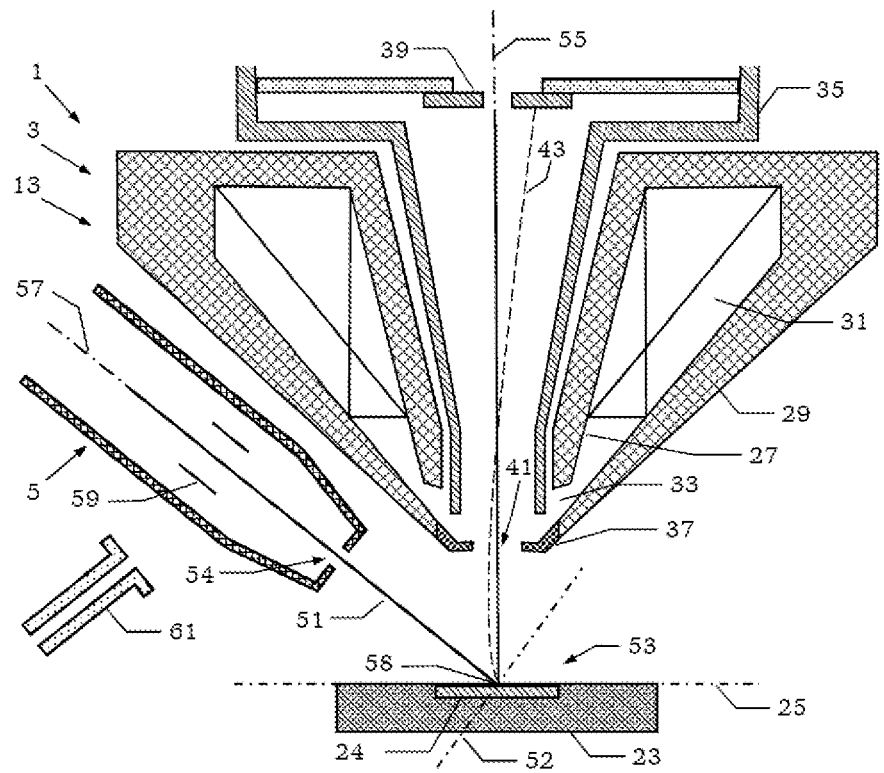
FIG. 3 shows the particle beam system shown in FIG. 1 in a second mode of operation.

The particle beam system 1 further includes a shielding electrode 61. In a first position, the shielding electrode can be disposed as illustrated in FIG. 1 and, in a second position, the shielding electrode can be disposed as illustrated in FIG. 3. In the first position, the shielding electrode 61 is disposed between the exit opening 54 of the ion beam column 5 and the coincidence point 58. In the second position, the shielding electrode 61 is not disposed between the exit opening 54 of the ion beam column 5 and the coincidence point 58.

In the first position, the shielding electrode 61 surrounds the principal axis 57 of the ion beam column 5 or the ion beam 51 at least in part between the exit opening 54 of the ion beam column 5 and the coincidence point 58. As a result, the shielding electrode 61 shields the ion beam 51 from the electric field generated by the electron beam column 3 between the end cap 37 and the object 23 such that electric field does not influence the trajectory of the ion beam 51, or influences it at least significantly less in comparison with the case where the shielding electrode 61 is disposed in the second position. As a result, the ion beam 51 can be directed on the object 23 with high precision.

The first mode of operation of the particle beam system 1 is distinguished in that, firstly, the surface portion 24 of the object 23 to be examined and to be processed is disposed substantially perpendicular to the principal axis 57 of the ion beam column 5 (in the common work region 53) and in that, secondly, the shielding electrode 61 is disposed in the first position. Three substantial advantages are achieved hereby. Firstly, the ion beam 51 is shielded by the shielding electrode 61 in relation to the electric field generated by the electron beam column 3 between the end cap 37 and the object 23, and so the ion beam 51 can be directed with high precision on the object 23. Moreover, the ion beam 51 can substantially perpendicularly strike the surface portion 24 of the object 23 to be processed, as a result of which the object 23 can be processed efficiently. Moreover, the shielding electrode 61 disposed in the first position acts on the electric field, the latter being formed in such a way that secondary particles emanating from the object 23 or the surface portion 24 can be detected efficiently with the detectors 39, 45 disposed in the interior of the electron beam column 3. The advantages mentioned last will be explained in more detail below with reference to FIGS. 5A and 5B.

Figure 2:
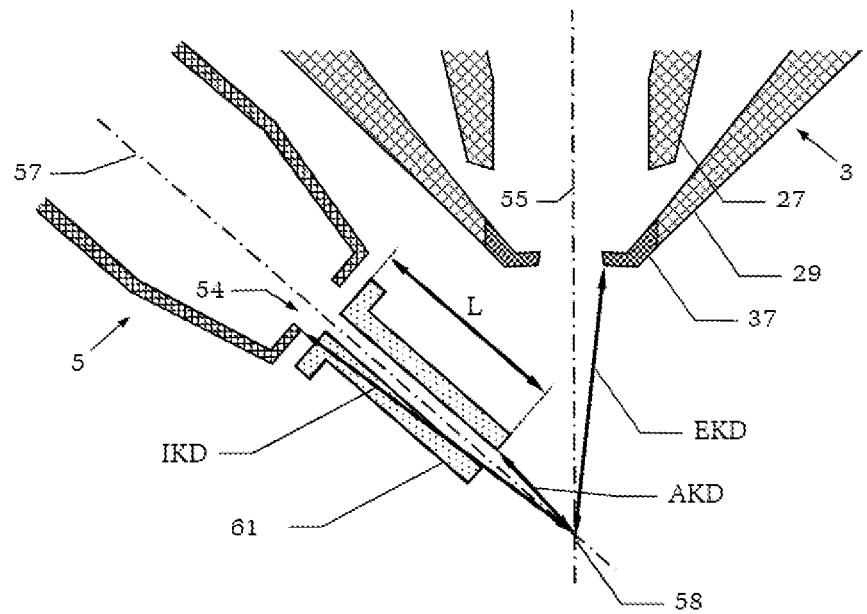
FIG. 2 shows a portion of the particle beam system shown in FIG. 1 for the purposes of elucidating distances.

FIG. 2 shows a detail of the particle beam system 1 illustrated in FIG. 1. FIG. 2 is used to explain distances that are referred to for the purposes of defining the particle beam system 1. An arrow EKD represents the shortest distance between the coincidence point and the electron beam column 3; this distance is referred to as electron beam column-coincidence point distance. The end cap 37 is that element of the electron beam column 3 that has the shortest distance from the coincidence point 58. An arrow IKD represents the shortest distance between the ion beam column 5 and the coincidence point 58; this distance is referred to as ion beam column-coincidence point distance. An arrow AKD represents the shortest distance between the shielding electrode 61 disposed in the first position and the coincidence point 58; this distance is referred to as shielding electrode-coincidence point distance.

The particle beam system 1 is distinguished in that the shielding electrode-coincidence point distance AKD is shorter than the electron beam column-coincidence point distance EKD when the shielding electrode 61 is disposed in the first position. Expressed differently, the shielding electrode 61, when disposed in the first position, is disposed closer to the coincidence point 58 than the electron beam column 3.

As a result, the ion beam 51 is shielded from the electric field, which is generated by the electron beam column 3, by the shielding electrode 61 to just before the coincidence point 58 such that the influence of the electric field on the ion beam 51 is substantially restricted to the path between the shielding electrode 61 and the coincidence point 58. As a result, the ion beam 51 can be directed on the object 23 with high precision.

The smaller the ratio of the shielding electrode-coincidence point distance AKD to the electron beam column-coincidence point distance EKD, the better shielding of the electron beam 51 by the shielding electrode 61 in relation to the electric field generated by the electron beam column 3. Therefore, the shielding electrode 61 can be formed in terms of its form and arrangement in such a way that the ratio of the shielding electrode-coincidence point distance AKD to the electron beam column-coincidence point distance EKD is no more than 0.9, preferably no more than 0.8 or more preferably no more than 0.7. In the example shown in FIG. 2, this ratio is approximately 0.45.

A further arrow in FIG. 2, denoted by the letter L, represents the length of the shielding electrode 61 along the principal axis 57 of the ion beam column 5. The ratio of the length L to the ion beam column-coincidence point distance IKD should be appropriately large so that a sufficiently large proportion of the path travelled by the ion beam 51 to the coincidence point 58 following the passage of the exit opening 54 is shielded by the shielding electrode 61. By way of example, the ratio of the length L of the shielding electrode 61 along the principal axis 57 of the ion beam column 5 to the ion beam column-coincidence point distance IKD is at least 0.2, preferably at least 0.35, further preferably at least 0.5. In the example shown in FIG. 2, the ratio is approximately 0.6.

FIG. 3 shows a detail of the particle beam system 1 illustrated in FIG. 1 in a second mode of operation. The second mode of operation is distinguished in that, firstly, the surface portion 24 of the object 23 to be examined and to be processed is disposed substantially perpendicular to the principal axis 55 of the electron beam column 3 and in that, secondly, the shielding electrode 61 is disposed in the second position.

Accordingly, the shielding electrode 61 is not disposed between the exit opening 54 of the ion beam column 5 and the coincidence point 58. In the second position, the shielding electrode 61 substantially does not influence the electric field that is generated between the end cap 37 and the object 23 by the electron beam column 3 and that is influenced by its form by the object or an object holder. Hence, the shielding electrode 61 disposed in the second position does not influence the trajectories of the electron beam 21 and the ion beam 51 either.

Therefore, the second mode of operation offers the advantage that the object 23 can be analysed with high precision via the electron beam column 3 since the surface portion 24 of the object 23 to be examined is disposed substantially perpendicular to the principal axis 55 of the electron beam column 3 and, as a result of this, the electric field of the coincidence point is already directed on the exit opening 41 of the electron beam column 3 in the case of slightly conductive objects. Consequently, the secondary particles emanating from the object 23 are efficiently accelerated to the exit opening 41 of the electron beam column 3 by the electric field, pass through the exit opening into the interior of the electron beam column 3 and are detected by detectors 39, 45 disposed in the interior of the electron beam column 3.

The particle beam system 1 may include a movement apparatus, not illustrated in the figures, that is configured to selectively dispose the shielding electrode 61 in the first position and in the second position. Accordingly, the movement apparatus can bring the shielding electrode 61 disposed in the first position into the second position and can bring the shielding electrode 61 disposed in second position into the first position.

Moreover, the object 23 can also be processed by the ion beam 51 in the second mode of operation, the influence of the electric field however having a negative effect on the precision.

The shielding electrode 61 can be formed or moved by the movement apparatus in such a way that the distance of the shielding electrode 61 from the object plane 25, when the shielding electrode 61 is disposed in the second position, is greater than or equal to the distance of the electron beam column 3 (or the end cap 37) from the object plane 25. As a result, the shielding electrode 61 has the same distance from the object as, or is further away from the object than, the electron beam column 3 or the end cap 37 when an object 23 with a plane surface is oriented substantially perpendicular to the principal axis 55 of the electron beam column 3. This facilitates a short working distance. Further, or alternatively, the movement apparatus can move the shielding electrode 61 in such a way that the shielding electrode 61, when the shielding electrode 61 is disposed in the second position, is removed so far from the common work region 53 that the shielding electrode 61 does not restrict the working distance of the electron beam column 3 when an object 23 with a plane surface is oriented substantially perpendicular to the principal axis 55 of the electron beam column 3. Consequently, a collision between the object and the particle beam system can be prevented when moving the object and in the case of a small working distance.

The electron beam 21 and the ion beam 51 can, both in the first mode of operation of the particle beam system 1, shown in FIG. 1, and also in the second mode of operation of the particle beam system 1, shown in FIG. 2, be directed on the same region of the object 23 one after the other or at the same time, firstly to generate image data on the basis of the detected secondary particles that represent an image of the object 23 and, secondly, to process the object 23 with the ion beam 51. The secondary particles used to generate the image data can be generated by the interaction of the electron beam 21 with the object 23 or by the interaction of the ion beam 51 with the object 23 or can be generated by the interaction of both the electron beam 21 and the ion beam 51 with the object 23.

The particle beam system 1 can further include a controller (not illustrated in the figures) that can control the electron beam column 3, the ion beam column 5 and the movement apparatus. In particular, the controller is configured to bring the particle beam system 1 into the first mode of operation. This is implemented by virtue of the shielding electrode 61 being disposed in the first position, as is illustrated in exemplary fashion in FIG. 1, and the surface portion 24 of the object 23 to be examined and to be processed being disposed substantially perpendicular to the principal axis 57 of the ion beam column 5, for example by way of a correspondingly controllable object holder. Further, the controller can bring the particle beam system 1 into the second mode of operation. This is implemented by virtue of the shielding electrode 61 being disposed in the second position and the surface portion 24 of the object 23 to be examined and to be processed being disposed substantially perpendicular to the principal axis 55 of the electron beam column 3. Further, the controller is configured to control the particle beam system 1 in such a way that it performs the methods described herein.

Figure 4A:
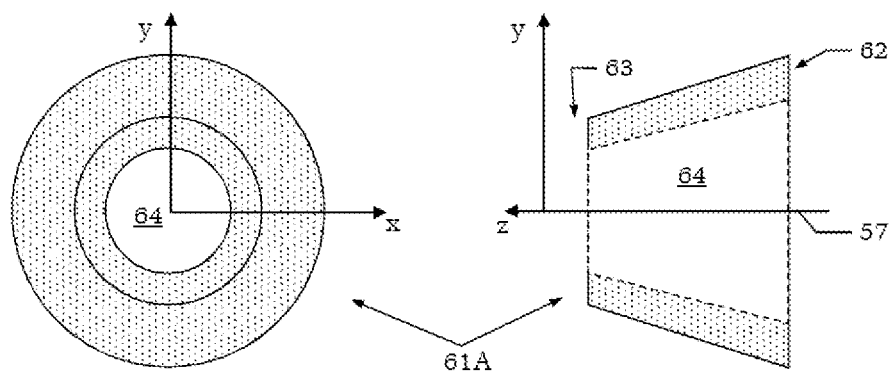
FIGS. 4A and 4B show exemplary forms of a shielding electrode.

FIG. 4A shows an exemplary configuration of a shielding electrode 61A, in a cross section in the yz-plane and in a plan view in the xy-plane. The xy-plane is oriented perpendicular to the z-axis. By way of example, the principal axis 57 of the ion beam column 5 penetrates the shielding electrode 61A along the z-axis when the shielding electrode 61A is disposed in the first position. The extent of the shielding electrode 61A at its ion beam column-side end 62 along the y-axis is greater than its extent in this direction at its coincidence point-side end 63. The shielding electrode 61A has the form of a hollow conical frustum. Accordingly, the shielding electrode 61A has a channel 64 in the interior thereof, through which the ion beam 51 can propagate in a straight line. The shielding electrode 61A extends along the z-axis, and consequently along the principal axis 57 of the ion beam column 5 when the shielding electrode 61A is disposed in the first position. The shielding electrode 61A is formed such that it encloses the principal axis 57. This is achieved by the channel 64.

Figure 4B:
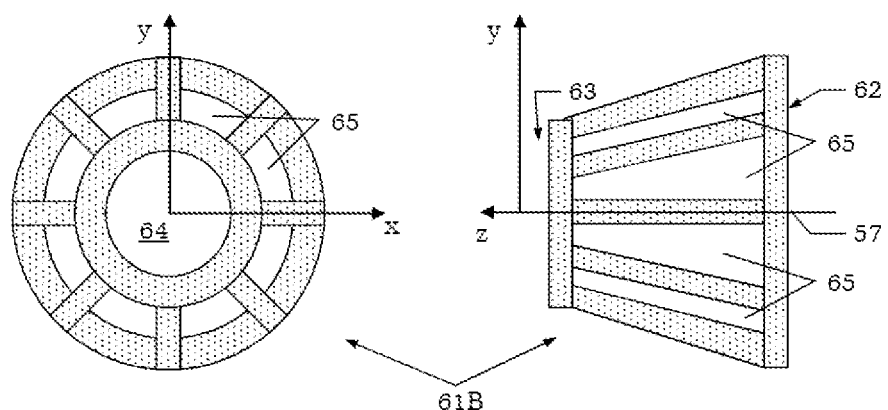

FIG. 4B shows a further exemplary configuration of a shielding electrode 61B. The shielding electrode 61B has the form of a hollow conical frustum, the cladding forming the conical frustum having numerous openings 65. The shielding electrode 61B, too, has a channel 64, through which the ion beam 51 can propagate in a straight line through the shielding electrode 61B. Numerous further forms are possible for the shielding electrode 61.

Figure 5A:
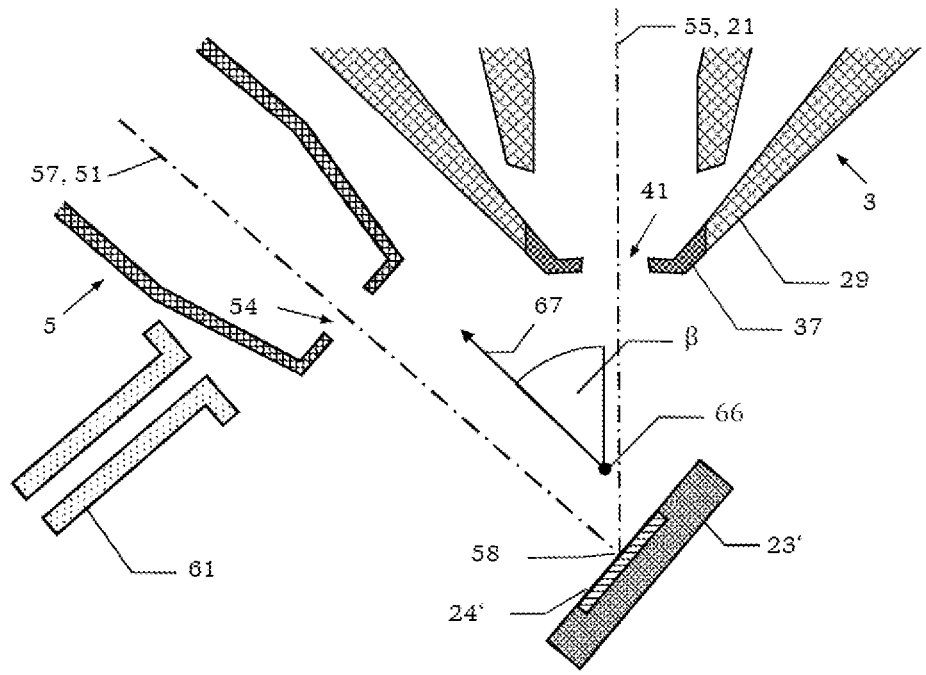
FIGS. 5A and 5B show an effect of the shielding electrode in a first and second position.

An effect of the shielding electrode 61 is explained with reference to FIGS. 5A and 5B. FIG. 5A shows a detail of the particle beam system 1 illustrated in FIG. 1, with the shielding electrode, in contrast to FIG. 1, being disposed in the second position and consequently having substantially no influence on the electric field that is generated by the electron beam column 3 between the end cap 37 and the coincidence point 58 and that is influenced in terms of its form by the test object 23' or an object holder. A plane metallic (and hence electrically conductive) surface 24' of the test object 23' is disposed substantially perpendicular to the principal axis 57 of the ion beam column 5.

Secondary particles generated by the interaction of the electron beam 21 with the test object 23' can be, for example, secondary electrons with a kinetic energy of the few eV and back-scattered electrons with a kinetic energy of, for example, several keV. Secondary particles generated by the interaction of the ion beam 51 with the test object 23' can be, for example, secondary electrons with an energy of a few eV.

The electric field that is generated between the end cap 37 and the coincidence point 58 by the electron beam column 3 and that is influenced in its form by the object or an object holder causes the secondary particles to be accelerated. Since secondary electrons have a low kinetic energy, the electric field has a great effect on the trajectory of the secondary electrons. Since the back-scattered electrons have a comparatively significantly higher kinetic energy, the electric field has a comparatively smaller effect on the trajectory of the back-scattered electrons.

The shielding electrode 61 is disposed in the second position in FIG. 5A. Therefore, the equipotential lines (not shown) of the electric field extend substantially parallel to the surface 24' of the test object 23' at the surface 24' of the test object 23'. This even applies, already, to objects with only little conductivity, in particular the object 23. An arrow 67 represents the direction and magnitude of the electric field at a test point 66. The test point 66 is disposed between the surface 24' of the test object 23' and the exit opening 41 of the electron beam column 3. Further, the test point has a distance from the coincidence point 58 and/or the surface 24' of the test object 23' of, for example, no more than 2000 μm or no more than 1000 μm. The arrow 67 also represents the force that acts on account of the electric field on a secondary electron positioned at the test point 66.

The acute angle β between the principal axis 55 of the electron beam column 3 and the direction of the electric field at the test point 66 (arrow 67) has a comparatively large first value. As a result, the secondary electron positioned at the test point 66 is accelerated away from the test object 23', but not in a direction towards the exit opening 41 of the electron beam column 3. Consequently, the secondary electron is not steered in a targeted fashion in a direction towards the detectors disposed in the interior of the electron beam column 3. Therefore, using the configuration shown in FIG. 5A, only a small proportion of the generated secondary electrons can be detected by detectors disposed in the interior of the electron beam column 3.

Figure 5B:
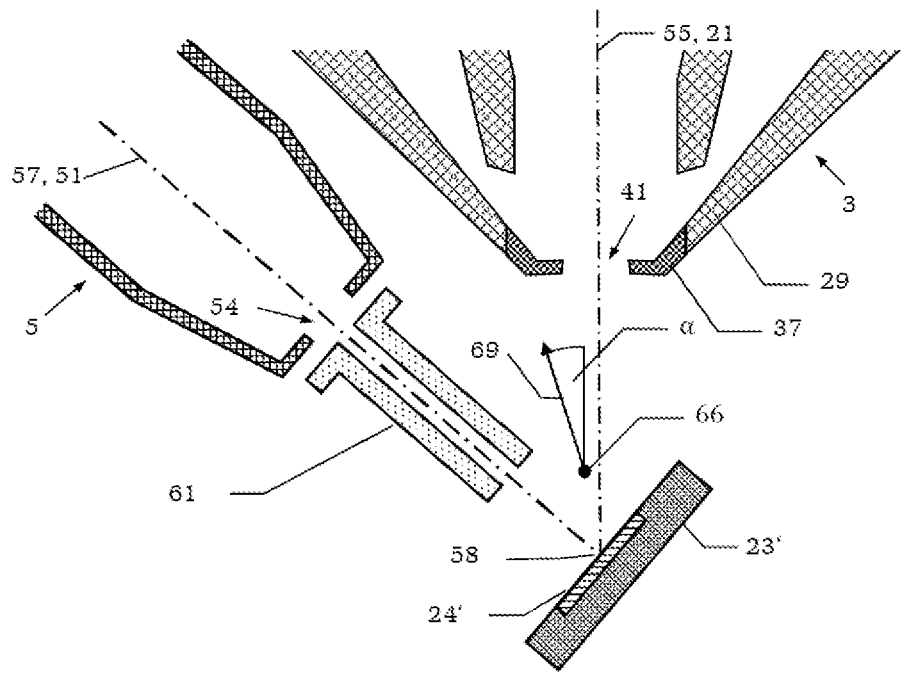

FIG. 5B shows the same detail as in FIG. 5A of the particle beam system 1 illustrated in FIG. 1, with the particle beam system being in the first mode of operation. Accordingly, the shielding electrode 61 is disposed in the first position, i.e., between the exit opening 54 of the ion beam column 5 and the coincidence point 58, and the shielding electrode at least partly encloses the principal axis 57 of the ion beam column 5 between the exit opening 54 and the coincidence point 58. Furthermore, the surface 24' of the test object 23' is disposed substantially perpendicular to the principal axis 57 of the ion beam column 5. Moreover, the electric field between the end cap 37 and the coincidence point 58 is generated in the same way as in FIG. 5A by the electron beam column 3 in conjunction with the test object 23' or an object holder.

The form of the field is influenced by the presence of the shielding electrode 61 disposed in the first position and by the potentials that are applied to the shielding electrode 61, the test object 23' and the end cap 37. In particular, the shielding electrode 61 in the first position influences the electric field in such a way that it has a direction and magnitude at the test point 66 as represented by the arrow 69.

The direction of the electric field present at the test point 66 (arrow 69) includes with the principal axis 55 of the electron beam column 3 an acute angle with the value of a, the angle being significantly smaller than the angle β in FIG. 5A. Therefore, in comparison with the situation shown in FIG. 5A, secondary electrons emanating from the test object 23' can be steered more efficiently to the exit opening 41 and supplied to the detectors disposed in the interior of the electron beam column 3 by way of the electric field.

Consequently, in addition to shielding the ion beam 51, the shielding electrode 61 in the first position causes secondary particles emanating from the test object 23' to be guided more efficiently to the exit opening 41 of the electron beam column 3, as a result of which a higher proportion of the generated secondary particles can be detected, improving the detection efficiency of the electron beam column 3.

With respect to FIGS. 6A and 6B, methods will be described below that can be carried out with the particle beam system 1.

Figure 6A:
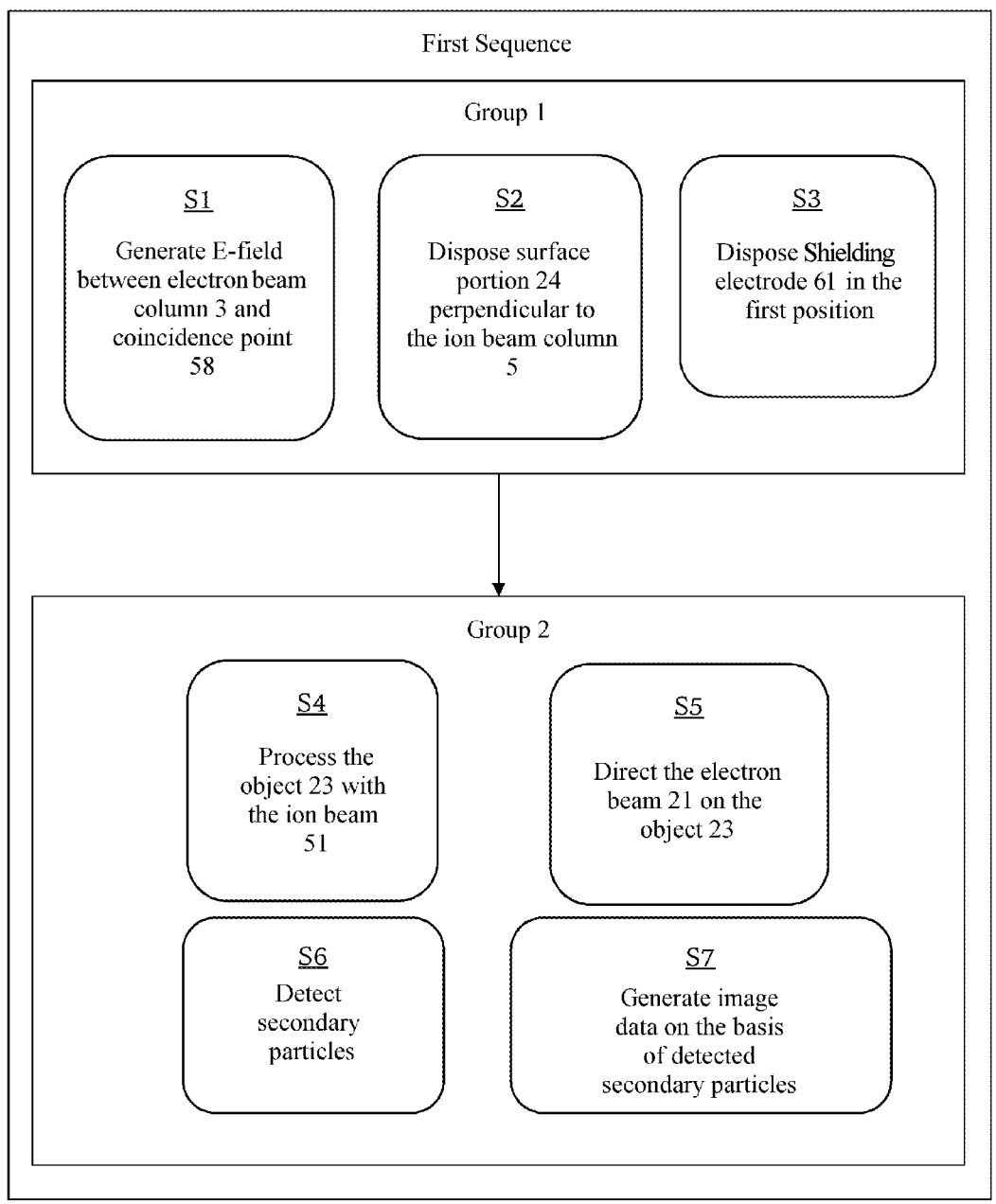
FIGS. 6A and 6B show an exemplary method for operating the particle beam system.
Figure 6B:
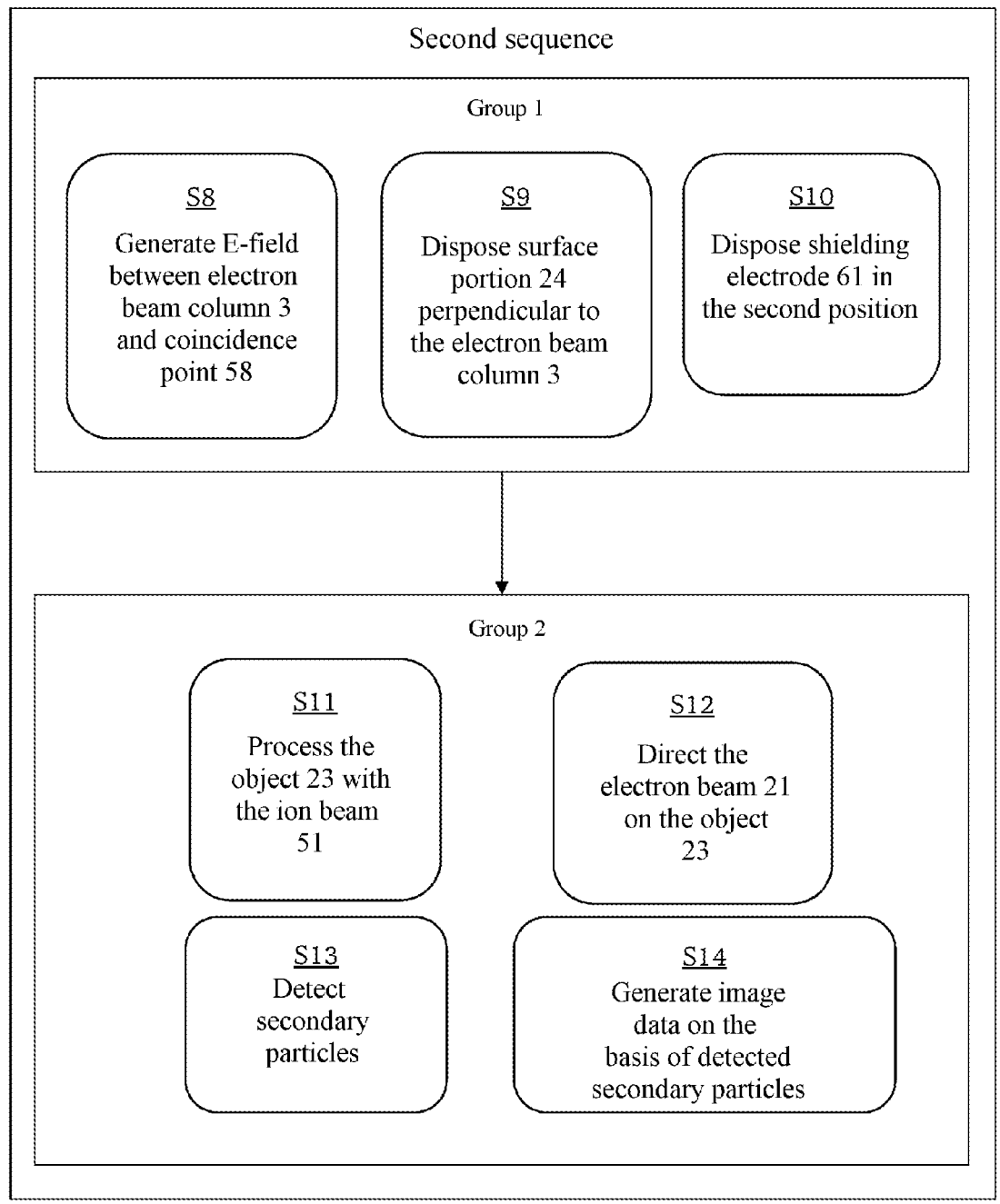

An exemplary method includes a first sequence, illustrated in FIG. 6A, and a second sequence, illustrated in FIG. 6B.

The first sequence includes a first group of steps (group 1) and a second group of steps (group 2), with the steps of the first group being carried out before the steps of the second group.

The steps of the first group of the first sequence are carried out in order to bring the particle beam system 1 into the first mode of operation. An electric field is generated between the electron beam column 3 and the coincidence point 58 in a first step S1 of the first group of the first sequence. A surface portion 24 of the object 23 to be examined and to be processed is disposed in a common work region 53 substantially perpendicular to the principal axis 57 of the ion beam column 5 in a step S2. Therefore, the surface portion 24 is disposed in the vicinity of the coincidence point 58. The shielding electrode 61 is disposed in the first position in a step S3. After carrying out the steps S1 to S3, the particle beam system is in the first mode of operation, as illustrated in FIG. 1.

The steps of the second group of the first sequence are carried out after steps S1 to S3 of the first group of the first sequence, while the particle beam system 1 is in the first mode of operation.

The second group of the first sequence may include the following steps: a step S4, in which the surface portion 24 of the object 23 is processed with the ion beam 51; a step S5, in which the electron beam 21 is directed on the surface portion 24 of the object 23 in order to produce secondary particles; a step S6, in which secondary particles emanating from the object 23 or the surface portion 24 are detected by detectors 39, 45 disposed in the electron beam column 3; and a step S7, in which image data are generated on the basis of the detected secondary particles, the image data representing an image of the object 23.

By way of example, the electron beam 21 or the ion beam 51, or both, are directed on the surface portion 24 of the object 23 in order to generate secondary particles. The secondary particles can be detected using the detectors 39, 45 disposed in the electron beam column 3. Image data that represent an image of the surface portion 24 of the object 23 can be generated on the basis of the detected secondary particles. The progress of the processing of the object 23 can be assessed and controlled based on the image data.

Before, after or at the same time, the ion beam 51 can be directed on the surface portion 24 of the object 23 so as to process it, i.e., remove material therefrom or deposit material thereon under the addition of a process gas.

The steps of the second group of the first sequence can be carried out multiple times within the first sequence, and can in particular be repeated. By way of example, the electron beam 21 is initially directed on the surface portion 24 of the object 23 in order to generate image data. For the subsequent processing of the surface portion 24 of the object 23 with the ion beam 51, the parameters are determined on the basis of the image data for the first sequence. After processing of the surface portion 24 with the ion beam 51 in the first sequence, the electron beam 21 can again be directed on the surface portion 24 in order to again generate image data, using which the object will again be processed using the ion beam 51. Accordingly, the steps of the second group of the first sequence can be repeated multiple times before the first sequence is ended and the second sequence takes place.

The second sequence can be carried out before and/or after the first sequence. The second sequence includes a first group of steps (group 1) and a second group of steps (group 2), with the steps of the first group being carried out before the steps of the second group.

The steps of the first group of the second sequence (cf., FIG. 6B) are carried out in order to bring the particle beam system 1 into the second mode of operation. An electric field is generated between the electron beam column 3 and the coincidence point 58 in the first step S8 of the first group of the second sequence. By way of example, the field generated during the first sequence is generated unchanged during the second sequence, too. The surface portion 24 of the object 23 to be examined and to be processed is disposed substantially perpendicular to the principal axis 55 of the electron beam column 3 in a step S9. The shielding electrode 61 is disposed in the second position in a step S10. After carrying out the steps S8 to S10, the particle beam system is in the second mode of operation, as illustrated in FIG. 3.

The steps of the second group of the second sequence are carried out after steps S8 to S10 of the first group of the second sequence, while the particle beam system 1 is in the second mode of operation.

The second group of the second sequence may include the following steps: a step S11, in which the surface portion 24 of the object 23 is processed with the ion beam 51; a step S12, in which the electron beam 21 is directed on the surface portion 24 of the object 23 in order to produce secondary particles; a step S13, in which secondary particles emanating from the surface portion 24 of the object 23 are detected by detectors 39, 45 disposed in the electron beam column 3; and a step S14, in which image data are generated on the basis of the detected secondary particles, the image data representing an image of the surface portion 24 of the object 23. Steps S11 to S14 substantially correspond to steps S4 to S7.

By way of example, the electron beam 21 or the ion beam 51, or both, are directed on the surface portion 24 of the object 23 in order to generate secondary particles. The secondary particles can be detected using the detectors 39, 45 disposed in the electron beam column 3. Image data that represent an image of the surface portion 24 of the object 23 can be generated on the basis of the detected secondary particles. The progress of the processing of the object 23 can be assessed and controlled based on the image data.

Before, after or at the same time, the ion beam can be directed on the surface portion 24 of the object 23 so as to process it, i.e., remove material therefrom or deposit material thereon under the addition of a process gas.

The steps of the second group of the second sequence can be carried out multiple times within the second sequence, and can in particular be repeated. By way of example, the electron beam 21 is initially directed on the surface portion 24 the object 23 in order to generate image data. For the subsequent processing of the surface portion 24 of the object 23 with the ion beam 51, the parameters are determined on the basis of the image data for the second sequence. After processing of the surface portion 24 of the object 23 with the ion beam 51 in the second sequence, the electron beam 21 can again be directed on the surface portion 24 of the object 23 in order to again generate image data, using which the object 23 will again be processed using the ion beam 51. Accordingly, the steps of the second group of the second sequence can be repeated multiple times before the second sequence is ended and the first sequence takes place.

The image data recorded during the first sequence can also be used to control the electron beam 21 and/or the ion beam 51 in the second sequence. The image data generated during the second sequence can likewise be used to control the electron beam 21 and/or the ion beam 51 during the first sequence.

Figure 7:
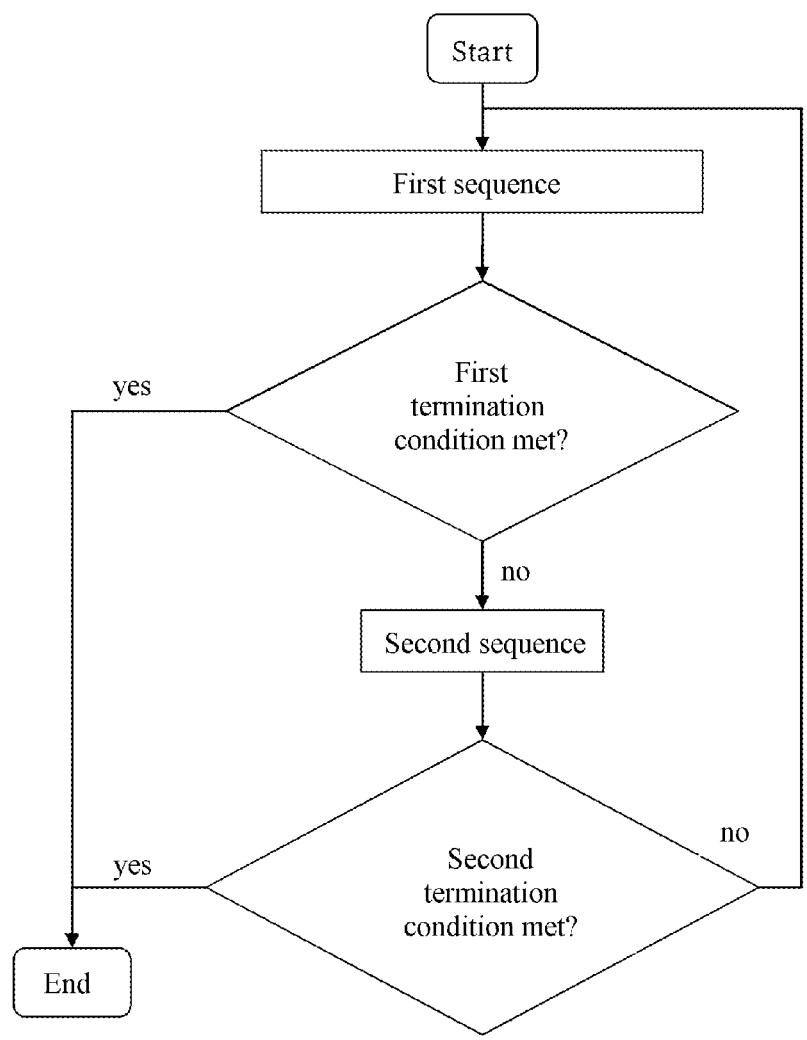
FIG. 7 shows a further exemplary method for operating the particle beam system.

FIG. 7 shows a further exemplary method for operating the particle beam system 1. The method begins by the steps of the first sequence being carried out. After the first sequence, a check is performed as to whether a first termination condition has been met. The first termination condition depends on what type of object is to be generated or on how the object is to be processed. By way of example, an assessment is made on the basis of the image data recorded in the first sequence as to whether the object has a desired shape. The first termination condition can also be that the object is processed and analysed to a predefined extent.

If the first termination condition has been met, the method ends. If the first termination condition has not been met, the steps of the second sequence are carried out.

After the steps of the second sequence have been carried out, a check is carried out as to whether a second termination condition has been met. The second termination condition can be the same as the first termination condition, but it can also differ from the first termination condition.

If the check of the second termination condition indicates that the second termination condition has been met, the method is ended. If the check of the second termination condition indicates that the second termination condition has not been met, the method is continued with the first sequence.

According to a modification of the method illustrated in FIG. 7, the check of the first or second termination condition can be omitted.

What is claimed is:
1. A particle beam system, comprising:
an electron beam column configured to generate an electron beam;
an ion beam column configured to generate an ion beam; and
a shielding electrode,
wherein:
the electron beam column and the ion beam column have a common work region;
the common work region comprises a coincidence point at which a principal axis of the electron beam column and a principal axis of the ion beam column meet;
the ion beam column comprises an exit opening from which the ion beam emerges from the ion beam column during use of the ion beam column;
when the shielding electrode is disposed in a first position, the shielding electrode at least partly surrounds the principal axis of the ion beam column between the exit opening of the ion beam column and the coincidence point; and
a shielding electrode-coincidence point distance is a shortest distance between the shielding electrode disposed in the first position and the coincidence point;
an electron beam column-coincidence point distance is a shortest distance between the electron beam column and the coincidence point;
the shielding electrode-coincidence point distance is less than the electron beam column-coincidence point distance.
2. The particle beam system of claim 1, wherein, when the shielding electrode is in the first position, a ratio of the shielding electrode-coincidence point distance to the electron beam column-coincidence point distance is at most 0.9.
3. The particle beam system of claim 1, wherein:
an ion beam column-coincidence point distance is a shortest distance between the ion beam column and the coincidence point; and
when the shielding electrode is in the first position, a ratio of the shielding electrode-coincidence point distance to the ion beam column-coincidence point distance is at most 0.5.
4. The particle beam system of claim 1, wherein:
an ion beam column-coincidence point distance is a shortest distance between the ion beam column and the coincidence point; and
a ratio of a length of the shielding electrode along the principal axis of the ion beam column to the ion beam column-coincidence point distance is at least 0.2.
5. The particle beam system of claim 1, wherein the shielding electrode comprises an electrically conductive surface.
6. The particle beam system of claim 1, wherein the shielding electrode comprises a form that extends along the principal axis of the ion beam column, enclosing the principal axis of the ion beam column.
7. The particle beam system of claim 1, wherein the shielding electrode has a second position in which the shielding electrode does not surround the principal axis of the ion beam column.
8. The particle beam system of claim 1, wherein:
the electron beam column comprises an exit opening from which the electron beam emerges from the electron beam column towards the common work region during use of the electron beam column;

the electron beam column is configured to generate an electric field between the exit opening of the electron beam column and the coincidence point; and the electric field is configured to decelerate the electron beam.

9. The particle beam system of claim 8, wherein the shielding electrode is configured so that, during use of the shielding electrode when disposed in the first position, the shielding electrode influences the electric field so that secondary particles emanating from the common work region are guided more efficiently to the exit opening of the electron beam column than when the shielding electrode is disposed in the second position.

10. The particle beam system of claim 8, wherein:

when a plane metallic surface of a test object is disposed at the coincidence point and the plane metallic surface of the test object is oriented substantially perpendicular to the principal axis of the ion beam column, an acute angle between the principal axis of the electron beam column and the direction of an electric field at a test point has a first value when the shielding electrode is disposed in the first position and has a second value when the shielding electrode is disposed in the second position; and the first value is less than the second value;

the test point is between the plane metallic surface of the test object and the exit opening of the election beam column; and the test point is no more than 2000 μm from the coincidence point or the surface of the test object.

11. The particle beam system of claim 1, wherein an interior of the electron beam column comprises a detector configured to detect secondary particles.

12. The particle beam system of claim 1, further comprising a potential source configured to apply an adjustable electric potential to the shielding electrode.

13. The particle beam system of claim 1, wherein:

the electron beam column comprises an end cap;

the end cap is the element of the electron beam column closest to the coincidence point; and the particle beam system further comprises a potential source configured to apply an adjustable electric potential to the end cap.

14. A method, comprising:

using the particle beam system of claim 1 to process an object by a method which comprises:

disposing the shielding electrode in the first position;

disposing the object in the common work region so that a surface portion of the object is oriented substantially perpendicular to the principal axis of the ion beam column;

processing the surface portion of the object with the ion beam while the shielding electrode is disposed in the first position and the surface portion is oriented substantially perpendicular to the principal axis of the ion beam column.

15. The method of claim 14, further comprising detecting secondary particles emanating from the surface portion of the object using a detector disposed in an interior of the electron beam column while the shielding electrode is disposed in the first position and the surface portion of the object is oriented substantially perpendicular to the principal axis of the ion beam column.

16. The method of claim 15, further comprising directing the electron beam on the surface portion of the object to generate the secondary particles.

17. The method of claim 14, further comprising:

disposing the shielding electrode in the second position;

disposing the object so that the surface portion of the object is oriented substantially perpendicular to the principal axis of the electron beam column; and directing the electron beam on the surface portion of the object and detecting secondary particles emanating from the surface portion as a result thereof using a detector disposed in an interior of the electron beam column, wherein directing and detecting are performed while the shielding electrode is disposed in the second position and the surface portion is oriented substantially perpendicular to the principal axis of the electron beam column.

18. The method of claim 17, wherein:

the method comprises first and second sequences;

the first sequence comprises steps when the shielding electrode is in the first position;

the second sequence comprises steps when the shielding electrode is in the second position; and the method further comprises repeatedly performing the first and second sequences in succession.

19. The method of claim 14, further comprising generating an electric field, wherein:

the electron beam exits from the electron beam column towards the common work region at an exit opening;

the electric field is generated between the exit opening and the coincidence point by the electron beam column; and the electric field decelerates the electron beam.

20. The method of claim 19, wherein:

the method comprises first and second sequences;

the first sequence comprises steps when the shielding electrode is in the first position;

the second sequence comprises steps when the shielding electrode is in the second position; and the method further comprises generating the electric field while the surface portion is processed by the ion beam in the first sequence and while secondary particles emanating from the surface portion are detected using a detector disposed in the interior of the electron beam column.

* * * * *

UNITED STATES PATENT AND TRADEMARK OFFICE
CERTIFICATE OF CORRECTION

Page 1 of 1

PATENT NO. : 10,984,977 B2
APPLICATION NO. : 16/706431
DATED : April 20, 2021
INVENTOR(S) : Erik Essers It is certified that error appears in the above-identified patent and that said Letters Patent is hereby corrected as shown below:

In the Specification

Column 15, Line 22, delete "a," and insert -- α, --.

Signed and Sealed this
Twenty-second Day of June, 2021

Drew Hirshfeld
*Performing the Functions and Duties of the*
*Under Secretary of Commerce for Intellectual Property and*
*Director of the United States Patent and Trademark Office*